United States Patent [19]

Ariyoshi et al.

[11] Patent Number: 5,306,943
[45] Date of Patent: Apr. 26, 1994

[54] SCHOTTKY BARRIER DIODE WITH OHMIC PORTION

[75] Inventors: Hisashi Ariyoshi; Masaaki Sueyoshi; Kouichi Sakamoto; Susumu Fukuda, all of Kyoto, Japan

[73] Assignee: Murata Manufacturing Co., Ltd., Japan

[21] Appl. No.: 860,440

[22] Filed: Mar. 30, 1992

[30] Foreign Application Priority Data

Mar. 28, 1991 [JP] Japan .................................. 3-105030
Jun. 28, 1991 [JP] Japan .................................. 3-185427

[51] Int. Cl.$^5$ ............................................. H01L 29/48
[52] U.S. Cl. .................................... 257/457; 257/472; 257/473; 257/916; 257/484; 257/750
[58] Field of Search ............... 257/457, 453, 466, 472, 257/473, 471, 916, 484, 483, 485, 486, 768, 769, 770, 750, 754, 757

[56] References Cited

U.S. PATENT DOCUMENTS

| | | | |
|---|---|---|---|
| 2,885,608 | 5/1959 | Bradley | 257/471 |
| 4,646,115 | 2/1987 | Shannon et al. | 257/484 |
| 4,729,966 | 3/1988 | Koshino et al. | 257/472 X |
| 4,899,199 | 2/1990 | Gould | 257/484 |

*Primary Examiner*—William Mintel
*Attorney, Agent, or Firm*—Ostrolenk, Faber, Gerb & Soffen

[57] ABSTRACT

A Schottky barrier diode includes a semiconductor substrate, an ohmic electrode formed on a first region of the semiconductor substrate, and a Schottky metal electrode formed on a second region spaced apart from the first region on the semiconductor substrate. The Schottky electrode includes at least one ohmic portion forming an ohmic contact with the semiconductor substrate, whereby rectifying characteristics of the Schottky barrier diode are improved.

16 Claims, 10 Drawing Sheets

SCHOTTKY BARRIER DIODE WITH OHMIC PORTION

BACKGROUND OF THE INVENTION

1. Field of the Invention

The present invention relates to a Schottky barrier diode and a method of manufacturing thereof, and more particularly, to a Schottky barrier diode having improved rectifying characteristics and a method of manufacturing thereof.

2. Description of the Background Art

FIG. 1 schematically shows a sectional view of a conventional Schottky barrier diode. Referring to FIG. 1, this diode has an ohmic metal electrode 20 and a Schottky metal electrode 30 provided on the bottom surface and the top surface, respectively, of a semiconductor substrate 10 having a plate configuration.

In a Schottky barrier diode utilizing rectifying characteristics by means of a metal/semiconductor junction, a depletion layer 11 is formed in the semiconductor in proximity to the metal/semiconductor junction interface so as to generate a built-in voltage, so that the Fermi level on both sides of the metal/semiconductor junction interface is identical. Since there are no charge carriers such as electrons and holes in depletion layer 11, it is necessary to lower the potential barrier height of depletion layer 11 by applying a forward voltage opposing the built-in voltage in order to obtain a forward current between Schottky electrode 30 and ohmic electrode 20. The forward voltage applied to lower the potential barrier height of depletion layer 11 is equivalent to the threshold voltage of the diode. Therefore, a forward direction voltage greater than the threshold voltage must be applied to obtain a flow of forward current.

A Schottky barrier diode employing a GaAs substrate has a built-in voltage greater than that of a diode employing a silicon substrate. This built-in voltage does not substantially change even if the type of the metal of the electrode is changed. This means that a Schottky barrier diode employing a GaAs substrate has rectifying characteristics in the forward direction inferior to those of one employing a silicon substrate.

A typical threshold voltage of a Schottky barrier diode using a GaAs substrate is 0.6 V. A forward voltage exceeding the threshold voltage of 0.6 V must be applied to establish a flow of forward current. If a forward voltage of 0.9 V, for example, is applied to establish a flow of forward current I, 0.6 V×I is consumed as power loss. Two thirds of the entire consumed power 0.9 V×I is spent as the power loss by the threshold voltage and is converted into undesired heat.

SUMMARY OF THE INVENTION

In view of the foregoing, an object of the present invention is to provide a Schottky barrier diode having improved rectifying characteristics and a method of manufacturing thereof.

According to an aspect of the present invention, a Schottky barrier diode includes a semiconductor substrate having a predetermined concentration of an impurity that determines a conductivity type of the semiconductor substrate, an ohmic metal electrode formed on a first region of the semiconductor substrate, and a Schottky metal electrode formed on a second region spaced apart from the first region of the semiconductor substrate. The Schottky electrode includes at least on ohmic region that forms an ohmic contact with the semiconductor substrate, whereby rectifying characteristics of the Schottky barrier diode are improved.

According to another aspect of the present invention, a method of manufacturing a Schottky barrier diode includes the steps of forming an ohmic metal electrode on a first region of a semiconductor substrate, forming at least one small ohmic contact metal film on a second region spaced apart from the first region of the semiconductor substrate, and then forming a Schottky contact metal film to cover the second region, whereby a Schottky metal electrode is easily formed that includes an ohmic contact metal film covered by a Schottky contact metal film with reliable electrical contact therebetween.

According to a further aspect of the present invention, a method of manufacturing a Schottky barrier diode includes the steps of forming an ohmic metal electrode on a first region of a semiconductor substrate, forming at least one ohmic contact metal film on a second region spaced apart from the first region of the substrate, etching anisotropically the second region of the substrate, excluding the region covered by the ohmic contact metal film to form a substrate projection beneath the ohmic contact metal film, and forming a Schottky contact metal film covering the ohmic contact metal film and the second region.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the drawings, corresponding components have identical reference numerals.

DESCRIPTION OF THE PREFERRED EMBODIMENTS

Figure 1:
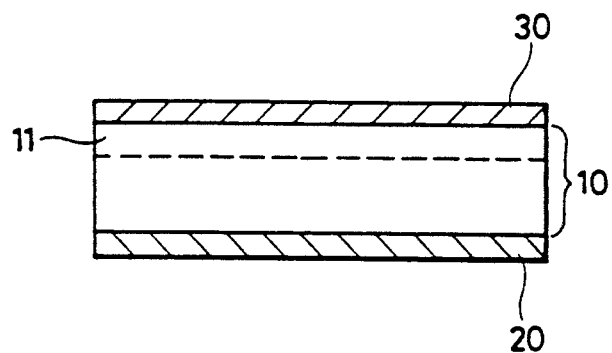
FIG. 1 is a sectional view of a conventional Schottky barrier diode.

A Schottky barrier diode will be described hereinafter according to an embodiment of the present invention with reference to FIGS. 2, 3A, and 3B. An ohmic electrode 20 is provided on the bottom main surface of a semiconductor substrate 10 such as a GaAs substrate. A small disc-like (for example, approximately 0.5 μm in diameter) ohmic contact metal film 31 is provided on the center portion of the top main surface of semiconductor substrate 10. A Schotty contact metal film 32 is provided on the surface of substrate 10, surrounding ohmic contact metal film 31 continuously. The electrically connected ohmic contact metal film 31 and Schottky contact metal film 32 form Schottky electrode 30. Although the shape of ohmic contact metal film 31 is not limited to a disc in any event its area is surrounded by Schottky electrode 30. It is to be noted that ohmic contact metal film 31 may be covered by Schottky contact metal film 32.

Figure 3A:
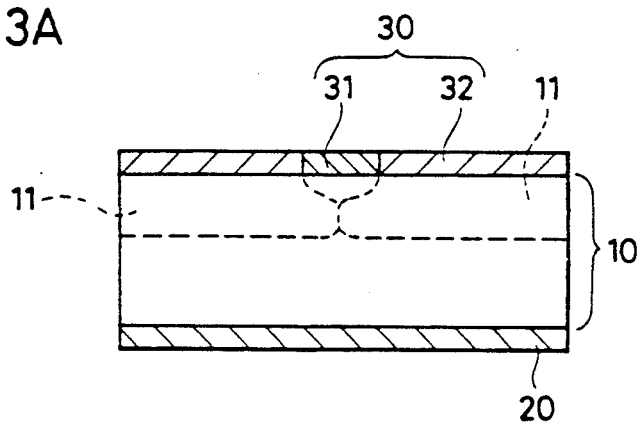
FIGS. 3A and 3B are sectional views of the diode of FIG. 2.

When voltage is not applied or reverse voltage is applied across Schottky electrode 30 and ohmic electrode 20 in this Schottky barrier diode, depletion layer 11 extends from the Schottky contact interface in semiconductor substrate 10, as shown in FIG. 3A. Depletion layer 11 spreads in the horizontal direction of semiconductor substrate 10, as well as in the depth direction. This means that not only the region beneath Schottky contact metal film 32, but also the region beneath ohmic contact metal film 31 is screened by depletion layer 11. As a result, the reverse current between Schottky electrode 30 and ohmic electrode 20 is blocked by depletion layer 11.

The extent of depletion layer 11 in the horizontal direction is not so great at the surface of the substrate, as compared with its extent beneath the surface, at the location of the film 31. In order to reliably block reverse current between Schottky electrode 30 and ohmic electrode 20, ohmic contact metal film 31 must be small enough to be reliably screened by the extension of depletion layer 11 in the horizontal direction.

Figure 2:
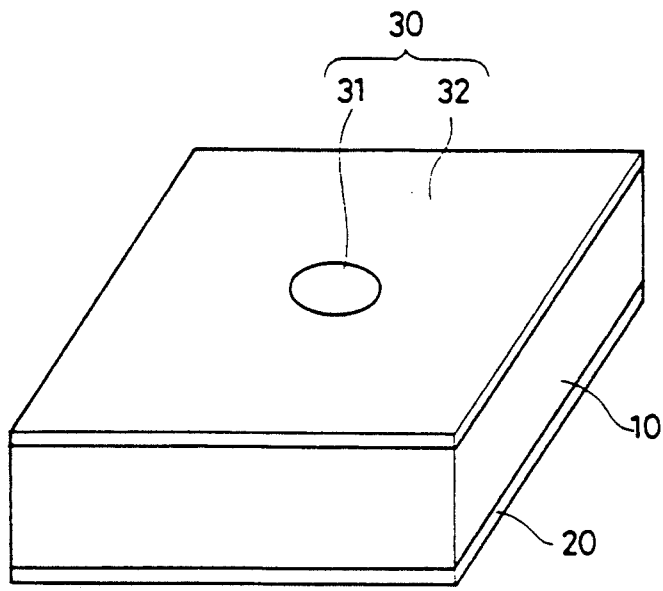
FIG. 2 is a perspective view of a Schottky barrier diode according to an embodiment of the present invention.
Figure 3B:
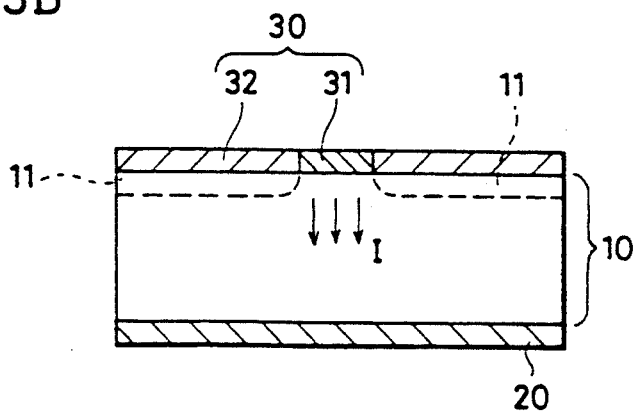

When forward voltage is applied between Schottky electrode 30 and ohmic electrode 20, the depth of depletion layer 11 beneath the Schottky contact interface is reduced, as shown in FIG. 3B. Since no depletion layer 11 exists in the region directly between ohmic contact metal film 31 and ohmic electrode 20, a current path can be formed. Thus, the application of a forward voltage causes the flow of forward current I between ohmic contact metal film 31 and ohmic electrode 20. Thus the absence of depletion layer 11 in the ohmic region where forward current I flows suppresses the wasteful voltage drop caused by depletion layer 11. This means that a forward current I of a sufficient level can be obtained by applying a small forward voltage; thus the diode of FIG. 2 has superior rectifying characteristics.

In order to prevent reverse current adequately, ohmic contact metal film 31 must be small enough to be screened by the extension of depletion layer 11 in the horizontal direction when the voltage applied to the diode is 0 V. However, an extremely small ohmic contact metal film 31 is not preferred facilitate the flow of forward current. This is because if the film 31 is extremely small a greater forward voltage will be required to eliminate the spread of depletion layer 11 in the horizontal direction under the region beneath ohmic contact metal film 31, to form a current path. The area of ohmic contact metal film 31 is set to an optimum value that can ensure the blockage of reverse current and that can enable forward current to be established by a small forward voltage.

Figure 4:
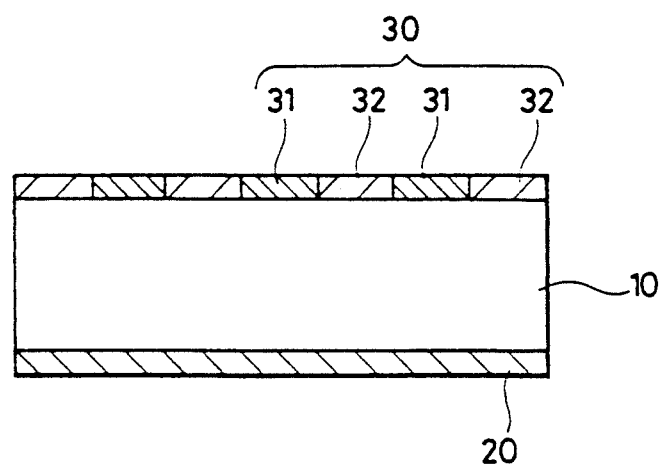
FIGS. 4-6 are sectional views of Schottky barrier diodes according to other embodiments of the present invention.

Referring to FIG. 4, a Schottky barrier diode according to another embodiment of the present invention is shown. This diode is similar to that of FIG. 3A, except that a plurality of ohmic contact metal films 31 are included in Schottky electrode 30. The diode of FIG. 4 can have the forward current density flowing per one ohmic contact metal film 31 reduced with the same total current flowing through the diode. Therefore, a flow of a greater forward current can be established as the entire diode. The plurality of ohmic contact metal films 31 are not limited to a disc shape, and may be shaped as a rectangle, a polygon, a narrow stripe, a thin ring, or a narrow stripe network.

Figure 5:
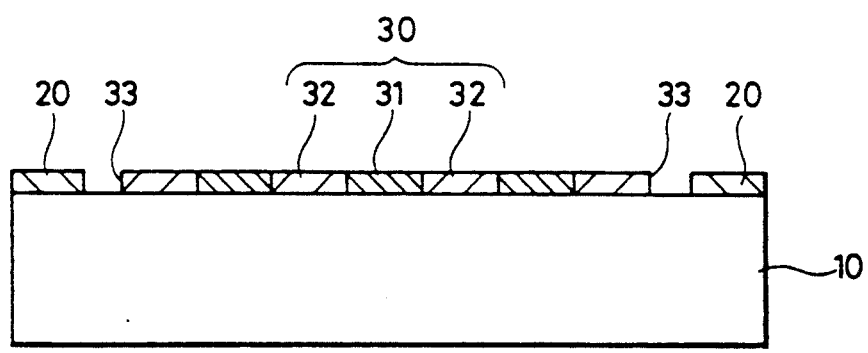

FIG. 5 shows a Schottky barrier diode according to a further embodiment of the present invention. This diode is similar to that of FIG. 4, except that ohmic electrode 20 and Schottky electrode 30 are provided on the same main surface of semiconductor substrate 10. More specifically, ohmic electrode 20 is separated form Schottky electrode 30 on the top side main surface of semiconductor substrate 10. Ohmic electrode 20 is formed in a ring configuration to surround Schottky electrode 30. On applying forward voltage to this diode, forward current flows from the plurality of ohmic regions 31 in Schottky electrode 30 to the ring-shaped ohmic electrode 20 through the upper layer portion of semiconductor substrate 10. In this embodiment, the ring-shaped ohmic electrode 20 is provided along the peripheral edge 33 of Schottky electrode 30 and serves as a guard ring to prevent the generation of voltage breakdown at peripheral edge 33 of Schottky electrode 30.

Figure 6:
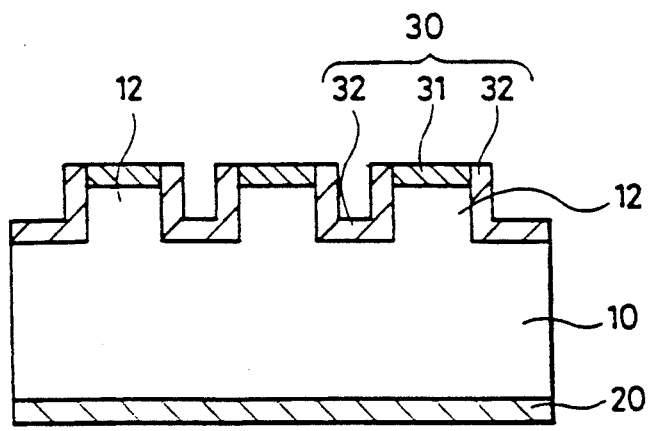

FIG. 6 shows a Schottky diode according to still another embodiment of the present invention. This diode is similar to that of FIG. 4, except that a plurality of projections 12 are formed at the upper side of semiconductor substrate 10. The plurality of projections 12 may be formed by etching semiconductor substrate 10, or by deposition utilizing semiconductor crystal growth or the like. The top face of each projection 12 is covered with an ohmic contact metal film 31. The surface of substrate 10 excluding projection 12 and the sidewall of projection 12 are covered with a Schottky contact metal film 32.

In the Schottky barrier diode of FIG. 6, depletion layer 11 extends from each sidewall of projection 12 inwardly under the influence of Schottky contact metal film 32 formed on each sidewall of projection 12. Therefore, when reverse voltage is applied, ohmic contact metal film 31 formed on the surface of projection 12 can reliably be screened by depletion layer 11 to ensure the blockage of reverse current.

Figure 7A:
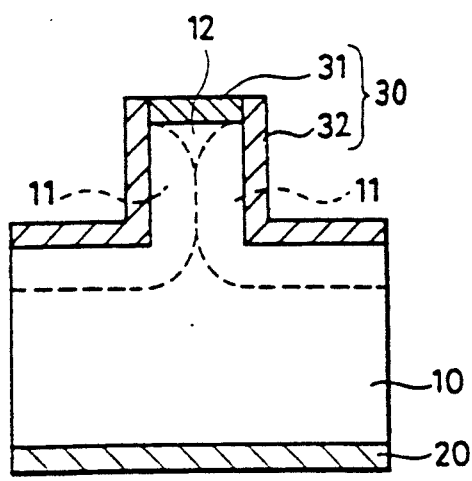
FIGS. 7A and 7B are sectional views of the diode of FIG. 6 for describing the operation thereof.
Figure 7B:
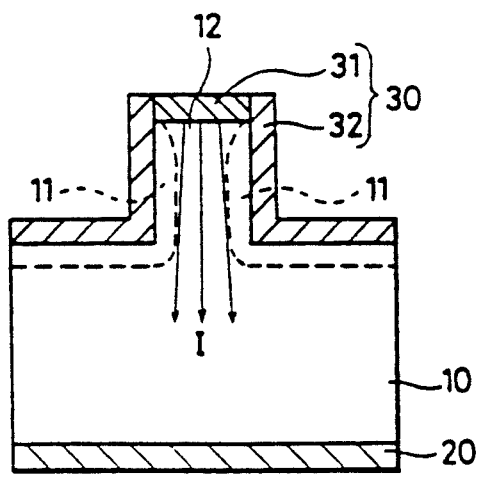

When forward voltage is applied, the depletion layer 11 along each sidewall of projection 12 is thinner, as shown in FIG. 7B. Therefore, forward current I can flow between ohmic contact metal film 31 and ohmic electrode Although each sidewall of projection 12 is covered with Schottky contact metal film 32 in the diode of FIG. 6, the sidewalls of projection 12 may alternatively be covered with ohmic contact metal film 31 instead. This is because the depletion layer which will extend in the horizontal direction from the edge of Schottky contact metal film 32 in the proximity of the root of projection 12 is capable of screening projection 12.

Figure 8:
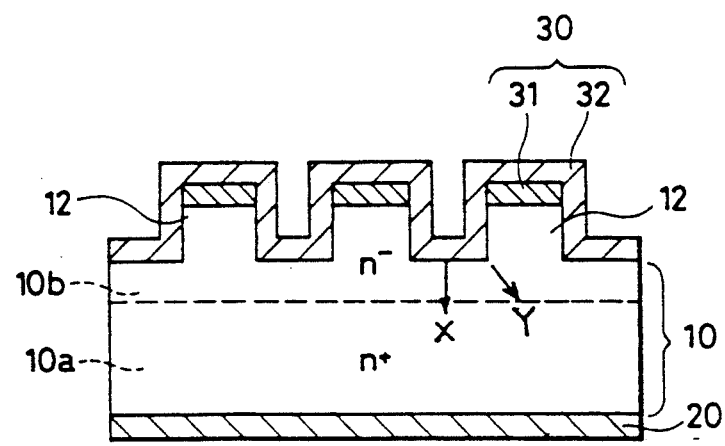
FIGS. 8 and 9 are sectional views of Schottky barrier diodes according to other embodiments of the present invention.

FIG. 8 shows a Schottky barrier diode according to a still further embodiment of the present invention. The diode is similar to that of FIG. 6, having a plurality of projections formed on the upper side of semiconductor substrate 10. However, the semiconductor substrate 10 of FIG. 8 includes a first layer 10a of a high impurity concentration (n+), and a second layer 10b of low impurity concentration (n−) provided thereupon. The projections 12 are formed in the region of n− layer 10b. Therefore, a depletion layer easily spreads in each projection 12 when reverse voltage is applied, to block reverse current in a more reliable manner.

Figure 9:
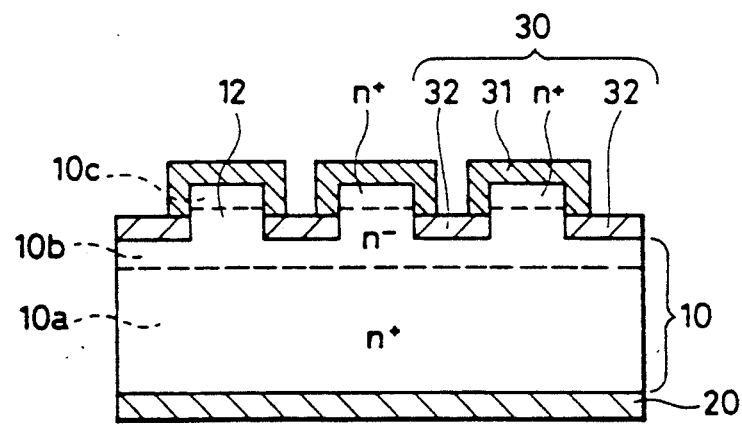

FIG. 9 shows a Schottky barrier diode according to yet a further embodiment of the present invention. This diode is similar to that of FIG. 8, except that semiconductor substrate 10 further includes a third layer 10c of high impurity concentration (n+) formed on second layer 10b. The root portion of each projection 12 is located in second layer 10b. Each third layer 10c is located at the upper portion of a respective projection 12. Not only the top surface, but also at least one portion of the sidewall of projection 12, is covered with ohmic contact metal film 31.

When reverse voltage is applied to such a diode, a depletion layer easily expands in the proximity of the root of projection 12 since that portion is formed of an n− layer 10b. Thus, the reverse current is reliably blocked. When forward voltage is applied, the flow of forward current between ohmic contact metal film 31 and ohmic electrode 20 is facilitated because a smaller electric resistance exists at the upper portion of projection 12, since it is formed of an n+ layer 10c.

Figure 10A:
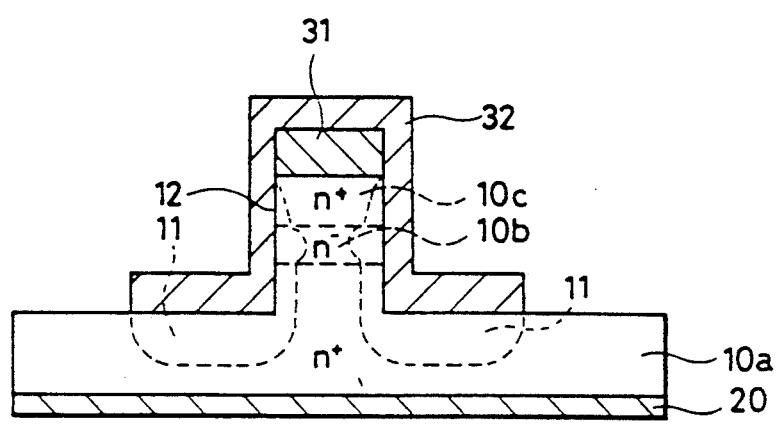
FIGS. 10A and 10B are sectional views for describing the operation of a Schottky barrier diode according to yet another embodiment of the present invention.
Figure 10B:
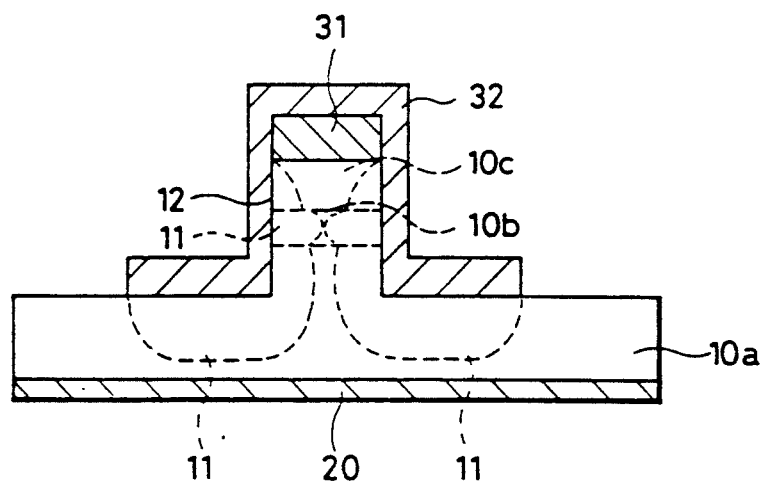

FIGS. 10a and 10b show a Schottky barrier diode according to yet another embodiment of the present invention. This diode has a relatively thin n− layer 10b which is located at an intermediate level within projection 12. FIG. 10A shows the state of depletion layer 11 when forward voltage is applied. The application of forward voltage results in a thinning of the depletion layer 11 along Schottky contact metal film 32 on the sidewall of projection 12. In addition, because n layer 10b is thin between ohmic contact metal film 31 and ohmic electrode 20, the forward current can easily flow through the n+ regions.

FIG. 10B shows the state of depletion layer 11 when reverse voltage is applied. The application of reverse voltage thickens the depletion layer along Schottky contact metal film 32 at the sidewall of projection 12. The spread of depletion layer 11 in the horizontal direction is particularly noticeable in n− layer 10b due to the low impurity concentration of second layer 10b. Ohmic contact metal film 31 is completely screened by depletion layer 11 extending in n− layer 10b so that reverse current is blocked between ohmic contact metal film 31 and ohmic electrode 20.

Project 12 may be formed to have a width of 1 μm and a height of 3 μm. The n− layer 10b in projection 12 may be formed to have a thickness of approximately 1 μm with an impurity concentration of approximately $5 \times 10^{13}/cm^3$. The other regions in projection 12 excluding n− layer 10b may have an impurity concentration of approximately $1 \times 10^{18}/cm^3$.

There may alternatively be a continuous change in impurity concentration in projection 12. For example, the impurity concentration may be approximately $1 \times 10^{18}/cm^3$ in the proximity of the upper portion of projection 12 may be be reduced according to a Gaussian distribution to approximately $5 \times 10^{13}/cm^3$ as a function of depth. With this impurity distribution, the flow of forward current is facilitated by the high impurity concentration at the upper portion of projection 12, while the expansion of depletion layer 11 is facilitated by the low impurity concentration at the bottom portion.

Figure 11:
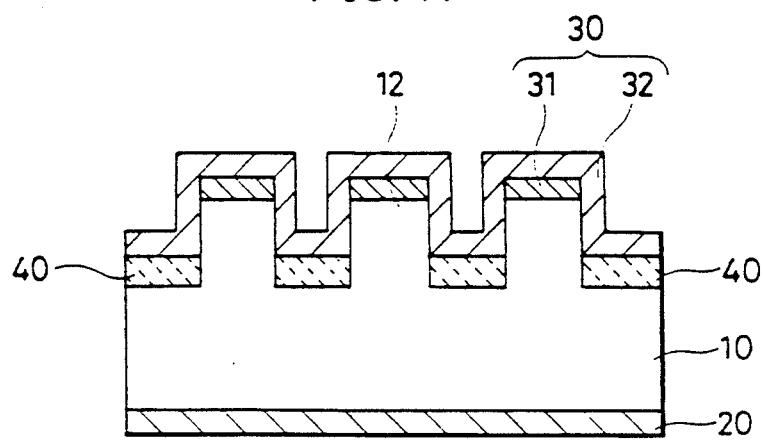
FIGS. 11 and 12 are sectional views of Schottky barrier diodes according to still further embodiments of the present invention.

FIG. 11 shows a Schottky barrier diode according to yet another embodiment of the present invention. This diode is similar to that of FIG. 6, except that an insulation layer or a high resistance layer 40 is inserted between the surface of semiconductor substrate 10, excluding projection 12, and Schottky contact metal film 32. The insulation layer or high resistance layer 40 serves to reliably prevent reverse current between ohmic electrode 20 and Schottky contact metal film 32.

Figure 12:
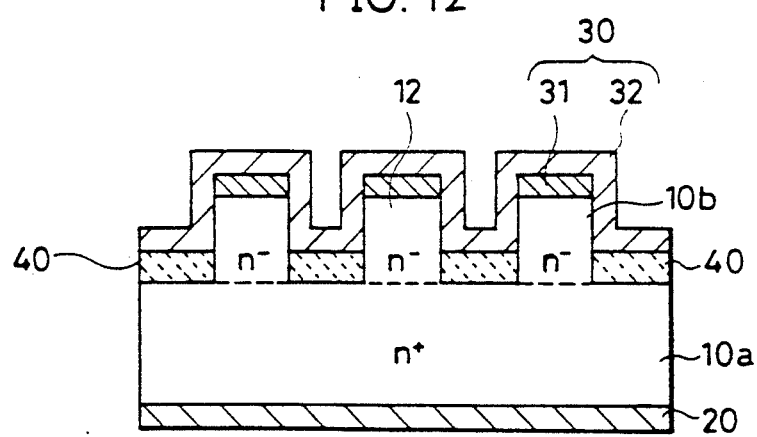

FIG. 12 shows a Schottky barrier diode according to an additional embodiment of the present invention. This diode is similar to that of FIG. 11, except that projection 12 is formed of an n− layer 10b of low impurity concentration. For example, projection 12 can have an impurity concentration of approximately $10^{13} - 10^{16}/cm^3$, while the portion of the semiconductor substrate other than projection 12 may have an impurity concentration of approximately $10^{18}/cm^3$.

In a diode as shown in FIG. 8 that does not have such an insulation layer 40 formed therein, a leakage current may be caused by a punch through phenomenon, as shown by arrow X, when the thickness of the depletion layer beneath Schottky contact metal film 32 is not sufficient. Furthermore, there may be a breakdown caused by the edge effect at the portion where Schottky contact metal film 32, bends as shown by arrow Y. The insulation layer 40 of FIG. 12 serves to prevent leakage current by punch through or breakdown by edge effect.

Figure 13:
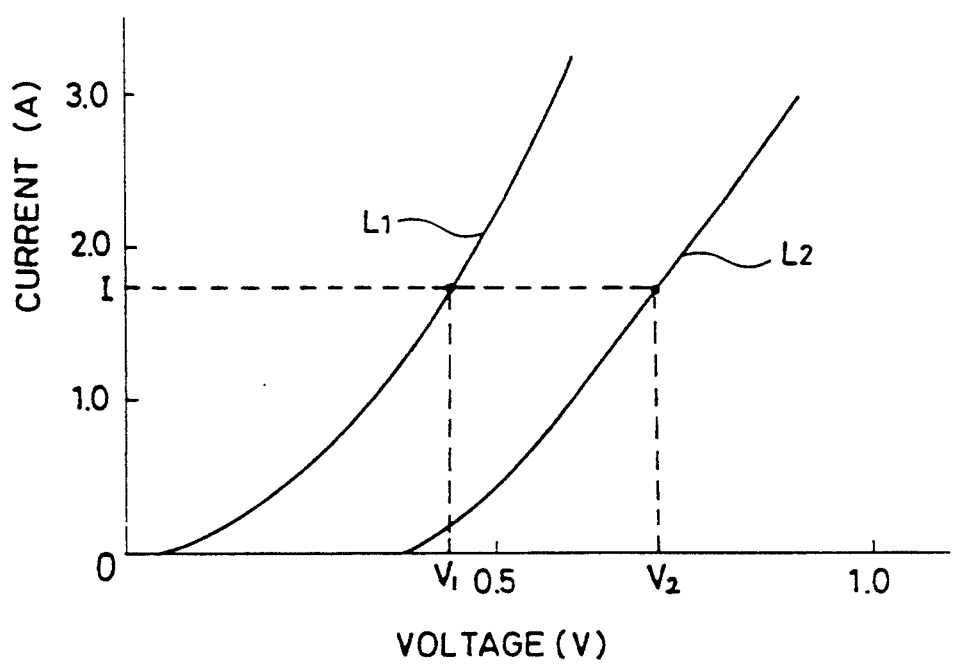
FIG. 13 is a graph showing rectifying characteristics of the diode of the embodiment of FIG. 8.

The graph of FIG. 13 shows a comparison of the rectifying characteristics of a Schottky barrier diode according to the FIG. 8 embodiment of the present invention and the conventional Schottky barrier diode of FIG. 1. Referring to FIG. 13, the abscissa represents forward voltage (V), and the ordinate represents forward current (A). Curves L1 and L2 respectively show the forward voltage/current characteristics of the Schottky barrier diode according to the embodiment of FIG. 8 and those of the conventional Schottky barrier diode of FIG. 1. The rectangular area related to each of the curves L1, L2 in FIG. 14 corresponds to the power loss $V_1 I$ or $V_2 I$ consumed at a given current value I by the relevant diode. This power loss is converted into heat to raise the temperature of the diode.

It can be appreciated from the comparison of curves L1 and L2 of FIG. 13 that the Schottky barrier diode of the embodiment of FIG. 8 has a power loss considerably smaller than that of the conventional Schottky barrier diode of FIG. 1. It can be said that the Schottky barrier diode of the present embodiment has superior rectifying characteristics.

Figure 14A:
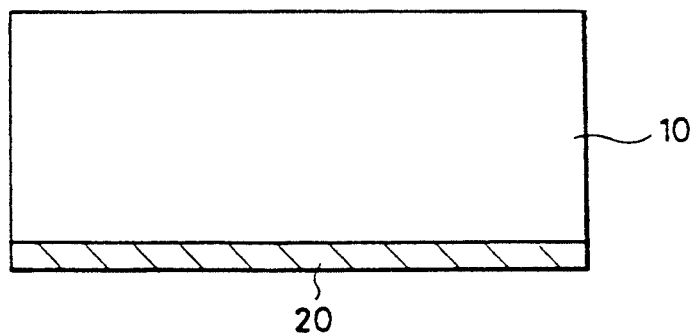
FIGS. 14A-14C are sectional views for describing the manufacturing method of a Schottky barrier diode according to an additional embodiment of the present invention.
Figure 14B:
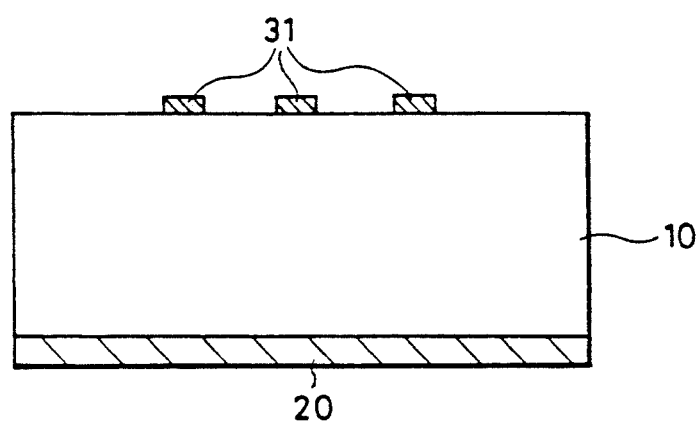
Figure 14C:
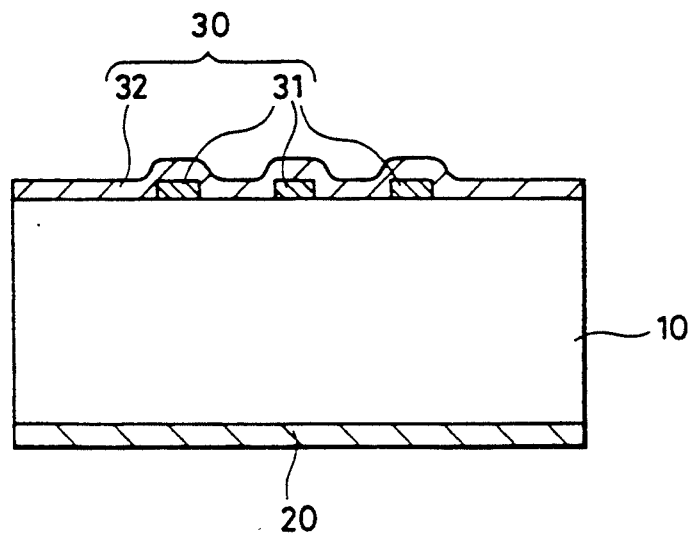

A method of manufacturing a Schottky barrier diode according to an additional embodiment of the present invention will be described with reference to FIGS. 14A-14C. Referring to FIG. 14A, ohmic electrode 20 is formed at on the bottom side of the main surface of semiconductor substrate 10 such as a GaAs substrate. Although it is economical to form ohmic electrode 20 at an earlier stage of manufacture, if may also be formed in the middle or at the last step of the manufacturing process. Referring to FIG. 14B, a plurality of ohmic contact metal films 31 are formed on the top side of the main surface of semiconductor substrate 10. The width of each ohmic contact metal film 31 is set to be not more than two times the depletion layer thickness in the horizontal direction when no voltage is applied, i.e., not more than two times the horizontal expansion of the depletion layer 11 under ohmic contact metal film 31 when no voltage is applied. Referring to FIG. 14C, Schottky contact metal film 32 if formed by vapor deposition or the like on the top face of the main surface of semiconductor substrate 10 covers ohmic contact metal film 31. Thus, ohmic contact metal film 31 and Schottky contact metal film 32 area in an electrically conductive contact. Although ohmic contact metal film 31 is covered by Schottky contact metal film 32, there is no effect on the ohmic contact at the interface of ohmic contact metal film 31 and semiconductor substrate 10.

The method of manufacturing the Schottky barrier diode of FIGS. 14A-14C does not require precise registration of the ohmic contact metal film 31 and the mask for forming the Schottky contact metal film, which is needed in manufacturing the embodiment of FIG. 2, nor the precise registration between ohmic contact metal film 31 and Schottky contact metal film 32. There is no possibility of incomplete electrical conduction being caused by a gap between ohmic contact metal film 31 and Schottky contact metal film 32. Schottky electrode 30 can therefore be formed precisely and easily.

The depletion layer thickness is related to the impurity concentration in proximity of the surface of semiconductor substrate 10. For example, if the impurity concentration is approximately $1 \times 10^{15}/cm^3$, the depletion layer thickness is approximately 1.5 $\mu$m. Therefore, the width of ohmic contact metal film 31 can easily be controlled to be not more than two times (3.0 $\mu$m) the depletion layer thickness. Even if the impurity concentration is as high as $5 \times 10^{15}/cm^3$, the depletion layer thickness is approximately 0.5 $\mu$m. Therefore, twice the depletion layer thickness is approximately 1 $\mu$m, and an ohmic contact metal film 31 that wide can easily be formed.

It is to be understood that ohmic contact metal film 31 may be covered with Schottky contact metal film 32 in the embodiments of FIGS. 4, 5, 6, and 9.

FIGS. 15A-15D shows a method of manufacturing a Schottky barrier diode according to yet another embodiment of the present invention.

Figure 15C:
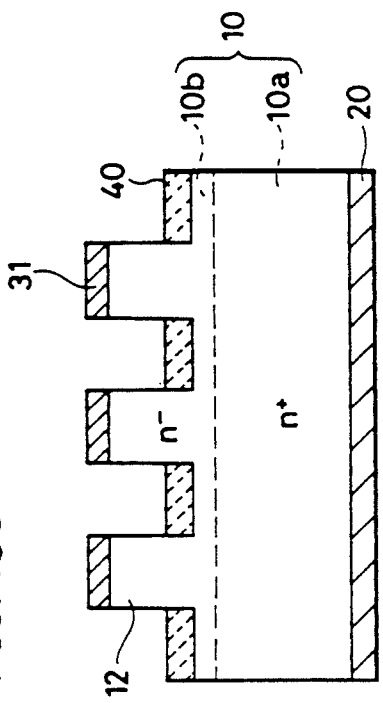
FIGS. 15A-15D are sectional views for describing the method of manufacturing a Schottky barrier diode according to yet another embodiment of the present invention.
Figure 15D:
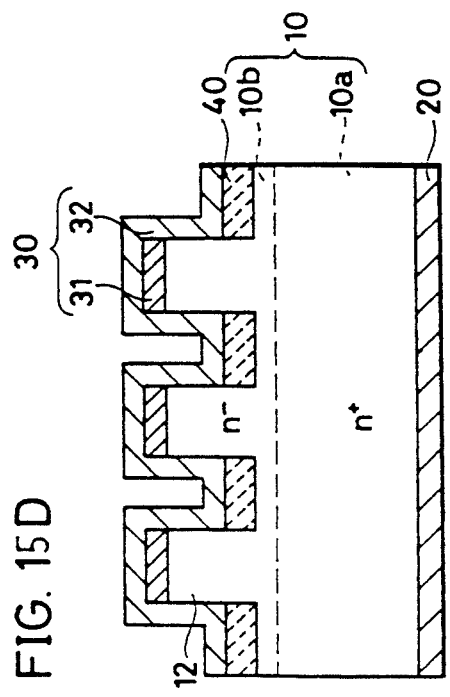
Figure 15A:
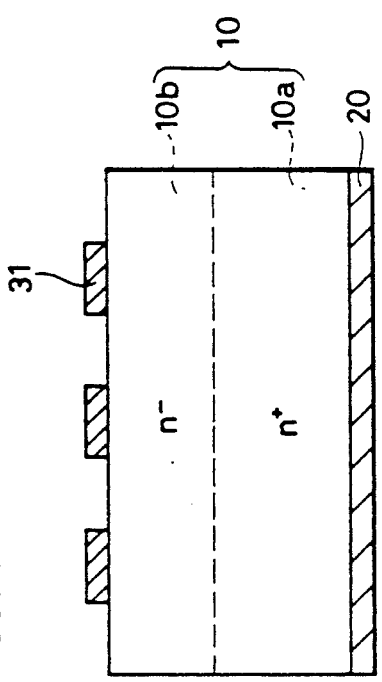

Referring to FIG. 15A, semiconductor substrate 10 comprises a high concentration impurity layer (n+ layer) 10a, and a low impurity concentration layer (n− layer) 10b thereupon. Ohmic electrode 20 is formed on the bottom side of the main surface of substrate 10. A plurality of ohmic contact metal films 31 are formed on the top side of the main surface of substrate 10.

Figure 15B:
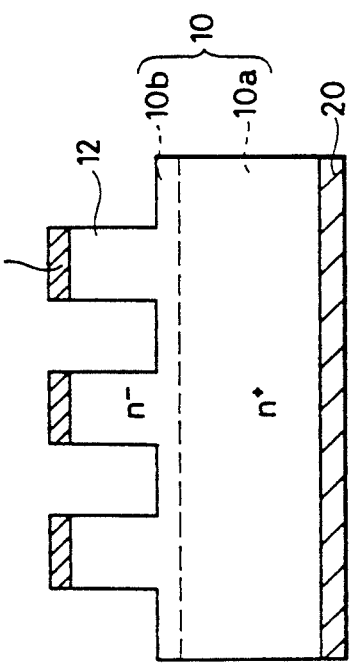

Referring to FIG. 15B, the surface of substrate 10 excluding the region which is covered by a plurality of ohmic contact metal films 31 is etched anisotropically by reactive ion etching to form a plurality of projections 12. Each projection 12 may be formed having a width of 0.5–1 $\mu$m and a height of 3–5 $\mu$m.

Referring to FIG. 15C, an insulation film or a high resistance film 40 such as silicon nitride or silicon dioxide film is deposited by the CVD method on the surface of substrate 10 excluding the plurality of projections 12.

Referring to FIG. 15D, ohmic contact metal film 31, the sidewall of projection 12, and insulation film 40 are covered with Schottky contact metal film 32 to implement a Schottky electrode 30 comprising ohmic contact metal film 31 and Schottky contact metal film 32.

According to the manufacturing method of FIGS. 15A-15D of a Schottky barrier diode, Schottky contact metal film 32 that is electrically connected to ohmic contact metal film 31 and the covers the sidewall of projection 12 can easily be formed without the need of any mask.

Although embodiments of the present invention have been described and illustrated in detail, it is clearly understood that the same is by way of illustration and example only and is not to be taken by way of limitation, the spirit and scope of the present invention begin limited only by the terms of the appended claims.

What is claimed is:

1. A Schottky barrier diode, comprising: a semiconductor substrate having a prescribed concentration of a conductivity-type-determining impurity,
    an ohmic electrode formed on a first region of said semiconductor substrate, and
    a Schottky electrode formed on a second region spaced apart from said first region of said semiconductor substrate,
    wherein said Schottky electrode includes at least one Schottky portion and at least one ohmic portion both forming a contact with said semiconductor substrate, the Schottky portion having means for forming a depletion layer adjacent said Schottky portion in said semiconductor substrate, and said ohmic portion having means for forming a reduced portion of said depletion layer adjacent said ohmic portion and thereby improving rectifying characteristics of said Schottky barrier diode.

2. The Schottky barrier diode according to claim 1, wherein said substrate has a plate-like configuration,
    said first region is located on a first main surface of said substrate, and
    said second region is located on a second main surface of said substrate.

3. The Schottky barrier diode according to claim 1, wherein
    said substrate comprises a plate-like configuration, and
    said first and second regions are both located on one main surface of said substrate.

4. The Schottky barrier diode according to claim 3, wherein said ohmic electrode surrounds said Schottky electrode so as to serve as a guard.

5. The Schottky barrier diode according to claim 1, wherein said second region comprises at least one projection extending away from said first region and wherein said ohmic portion covers at least a distal portion of said projection.

6. The Schottky barrier diode according to claim 5, wherein said ohmic portion further covers a sidewall of said projection.

7. The Schottky barrier diode according to claim 5, wherein said projection includes a transverse layer of semiconductor material having a relatively low concentration of a conductivity-type-determining impurity.

8. The Schottky barrier diode according to claim 5, wherein said projection includes semiconductor material having a relatively low concentration of a conductivity-type-determining impurity.

9. The Schottky barrier diode according to claim 5, wherein both said projection and a semiconductor layer which extends from the interface of said substrate and said Schottky electrode to a prescribed depth include semiconductor material having a relatively low concentration of a conductivity-type-determining impurity in said second region.

10. The Schottky barrier diode according to claim 5, further comprising a high resistance layer disposed between said Schottky electrode and said substrate beside said projection in said second region.

11. The Schottky barrier diode according to claim 5, further comprising an insulation layer disposed between said Schottky electrode and said substrate beside said projection in said second region.

12. The Schottky barrier diode according to claim 1, wherein said reduced portion of said depletion layer has a lower power loss than another portion of said deletion layer, for a given current flowing between said Schottky electrode and said ohmic electrode.

13. The Schottky barrier diode according to claim 1, wherein said reduced portion of said depletion layer adjacent to said ohmic portion is an extension of another portion of said depletion layer adjacent said Schottky portion, and said reduced portion substantially disappears when a given forward voltage is applied between said Schottky electrode and said ohmic electrode.

14. The Schottky barrier diode according to claim 13, wherein an extent of said ohmic portion within said second region is selected to be small enough so that said reduced depletion layer will exist adjacent said ohmic portion when a reverse or negative voltage is applied, but large enough so that said reduced depletion layer will disappear when said given forward voltage is applied, between said Schottky electrode and said ohmic electrode.

15. The Schottky barrier diode according to claim 1, wherein said ohmic portion of said Schottky electrode has a width no greater than 3.0 $\mu$m.

16. The Schottky barrier diode according to claim 15, wherein said ohmic portion of said Schottky electrode has a width of approximately 1.0 $\mu$m.

* * * * *